(12) United States Patent
Yoshizawa (10) Patent No.: US 6,593,803 B2
(45) Date of Patent: Jul. 15, 2003

(54) ACTIVE FILTER CIRCUIT (75) Inventor: Atsushi Yoshizawa, Kanagawa (JP)

(73) Assignee: Sony Corpration, Tokyo (JP)

( * ) Notice: Subject to any disclaimer, the term of this patent is extended or adjusted under 35 U.S.C. 154(b) by 0 days.

(21) Appl. No.: 10/215,870

(22) Filed: Aug. 9, 2002

(65) Prior Publication Data
US 2003/0034831 A1 Feb. 20, 2003

(30) Foreign Application Priority Data

Aug. 14, 2001 (JP) ........................................ 2001-245866

(51) Int. Cl.$^7$ ................................................ H03K 5/00
(52) U.S. Cl. ...................................................... 327/553
(58) Field of Search ................................ 327/552, 553, 327/157, 554, 555, 556, 557, 558, 559; 330/107, 305, 106

(56) References Cited

U.S. PATENT DOCUMENTS

| 5,550,520 A | * | 8/1996 | Kobayashi | 327/553 |
| 5,942,935 A | * | 8/1999 | Okanobu | 327/553 |
| 6,262,624 B1 | * | 7/2001 | Tsinker | 327/553 |

* cited by examiner

*Primary Examiner*—Dinh T. Le
(74) *Attorney, Agent, or Firm*—Jay H. Maioli (57) ABSTRACT

An active filter circuit capable of reducing power consumption without limiting dynamic range includes a switch section and a capacitance element disposed between an active filter section and a charge pump section. ON/OFF switching (short/open) of the switch section is controlled by a cut-off frequency judging section according to a status of an adjusting cut-off frequency of the active filter section. When the switch section is in the OFF condition, the capacitance element maintains a voltage to be supplied to a gate terminal and each circuit operation of a frequency adjusting section is stopped, thus reducing power consumption.

10 Claims, 9 Drawing Sheets

ACTIVE FILTER CIRCUIT

ACTIVE FILTER CIRCUIT

CROSS REFERENCE TO RELATED APPLICATIONS

This application claims priority to Japanese Patent Application No. JP 2001-245866, filed on Aug. 14, 2001, the disclosure of such application being herein incorporated by reference to the extent permitted by law.

BACKGROUND OF THE INVENTION

1. Field of the Invention

The present invention relates to an active filter circuit to be utilized in a variety of electronic devices, for example for deriving a signal under a designated frequency.

2. Description of Related Art

In a variety of electronic devices, various active filters are used in order to isolate and extract a specific signal or to remove noises from signals of a wide range of frequencies. As an example of such active filters, a MOSFET-C filter (a low pass filter) 100 as shown in FIG. 7 is known as a configuration of a monolithic active filter (an active filter formed as a semiconductor integrated circuit).

A MOSFET-C filter operates in a non-saturated area of a MOSFET (Metal Oxide Semiconductor Field-effect Transistor: a field-effect transistor having a metal oxide film semiconductor structure). In other words, the MOSFET-C filter utilizes a linear operating area as a variable resistance, and it is known as a filter (a triode filter) which utilizes triode action as a variable resistance.

Figure 7:
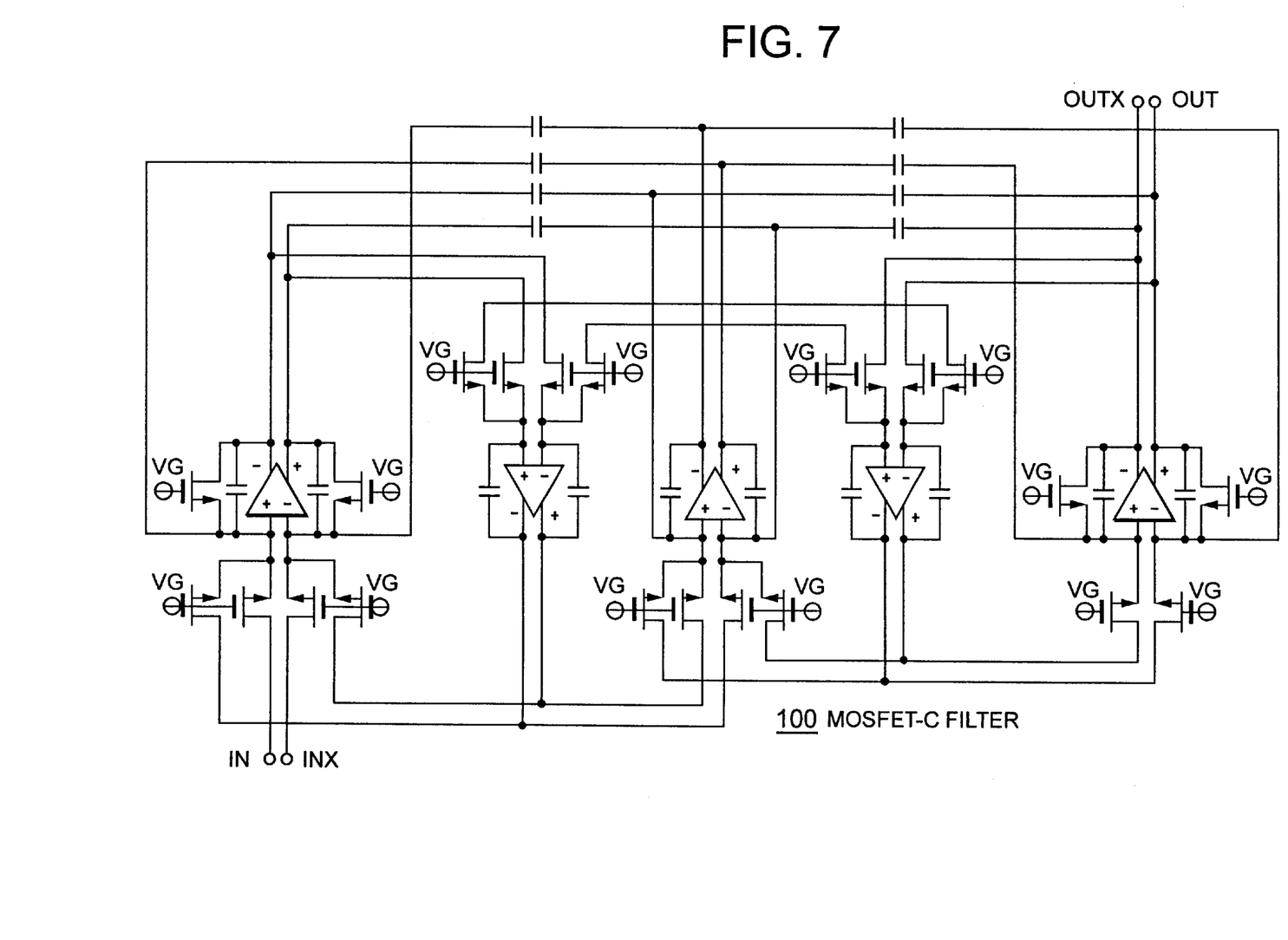
FIG. 7 is a circuit diagram showing an example of a MOSFET-C filter.

In other words, a MOSFET-C filter 100 as illustrated in FIG. 7 is configured such that circuit sections each having a plurality of MOSFET used as variable resistors, capacitance elements and an operational amplifier are connected to each other in multi-stage and a plurality of capacitance elements are used.

As described in an existing document (M. Banu and Y. Tsividis, "An Elliptic Continuous-Time CMOS Filter with On-Chip Automatic Tuning," IEEE Journal of Solid-State Circuits, vol. 20, no.6, pp1114–1121, December 1985), a MOSFET-C filter IC (integrated circuit) operable with a ±5 V power supply has been realized by Banu et al.

In recent years, however, voltage of a power supply for an IC has been reduced because of requirements for a more efficient use of a battery taking in consideration installation of the battery in a so-called a mobile terminal such as a mobile communications terminal. Also, because of miniaturization of the semiconductor fabricating process, there is a strong need for an IC to be operable with a single power supply of 2.7 V or less.

Generally, a MOSFET-C filter needs a power supply of relatively high voltage as compared, for example, with a Gm-C filter (temporally continuous filter) which is another method for designing a monolithic filter. This is because, in order to let a MOSFET used as a variable resistor perform a good linear action (a triode action), sufficiently high gate voltage (VG) must be applied to the gate terminal of the MOSFET.

The MOSFET-C filter, therefore, has a serious drawback with respect to lowering the voltage of the power supply in terms of circuit design. Even in a conventional power supply of 2.7 V, it is difficult to obtain a MOSFET-C filter of a higher dynamic range.

Figure 8:
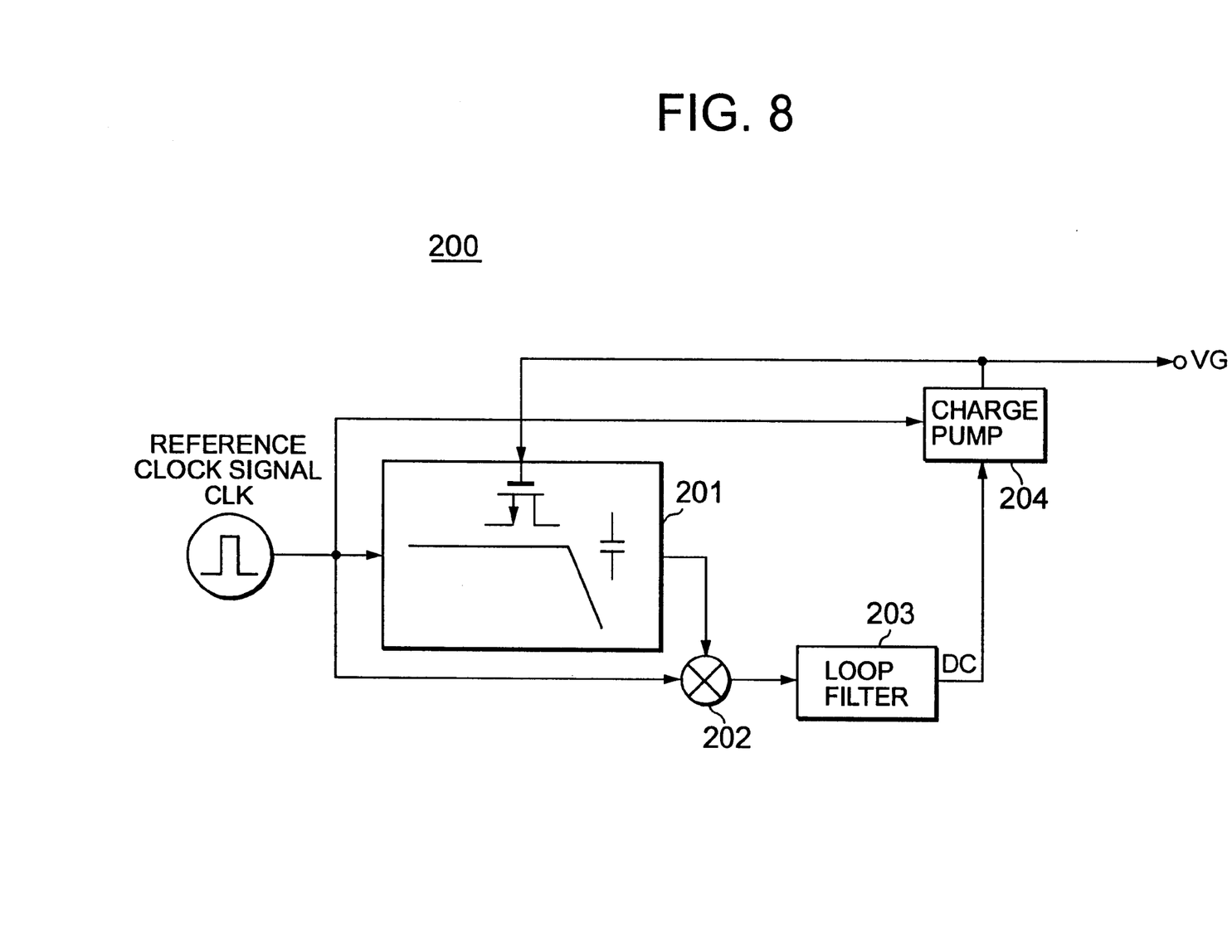
FIG. 8 is a block diagram for explaining a frequency adjusting section of the MOSFET-C filter as shown in FIG. 7.

In order to solve the problem, as shown in FIG. 8, for example, a charge pump section (a charge pump circuit) 204 is provided within a frequency adjusting section 200 which supplies a gate voltage (VG) to a gate terminal of each MOSFET of the MOSFET-C filter. The MOSFET-C filter 100 may be driven and controlled by the gate voltage (VG) which is increased to a higher voltage than that of the power supply in the charge pump section 204.

As shown in FIG. 7, for example, since a terminal used for frequency adjusting in the MOSFET-C filter 100 is the gate terminal of the MOSFET, a simple charge pump section may easily provide a gate voltage higher than the power supply voltage, thus the MOSFET filter 100 may be applied to a filter circuit having a high dynamic range which is required in a receiving circuit of a mobile communications terminal.

Figure 9:
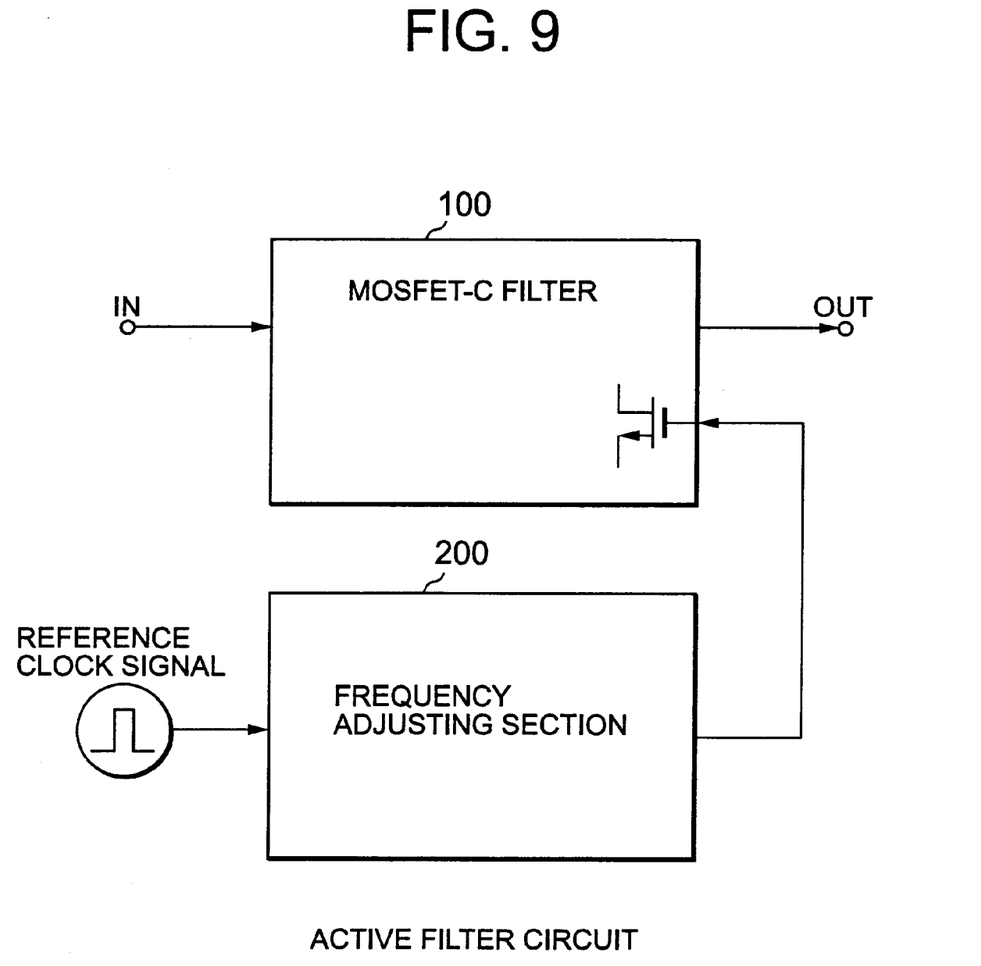
FIG. 9 is a block diagram for explaining an active filter circuit formed by the MOSFET-C filter as shown in FIG. 7 and the frequency adjusting section as shown in FIG. 8.

In other words, as shown in FIG. 9, the MOSFET-C filter 100 and the frequency adjusting section 200 supplying the gate voltage (VG) thereto make it possible to configure an active filter circuit having a high dynamic range.

It is to be noted that the frequency adjusting section 200 as shown in FIG. 8 is a design of so-called DLL (Delay Locked Loop) which is configured to be locked when a predetermined phase difference, 90 degrees, for example, is caused between a phase of an output signal from a filter (a MOSFET-C filter for frequency adjusting) 201 having a function of a delay circuit and that of an input signal (reference clock signal CLK) to the frequency adjusting section 200.

In this case, the output signal from the filter 201 and an input signal to the frequency adjusting section 200 are multiplied by a multiplier 202. The multiplier 202 outputs a signal comprised of a doubled signal component and a DC component which are supplied to a loop filter 203. The loop filter 203 extracts only the DC component, which is then supplied to a charge pump section 204 as a control signal.

A voltage charging action (voltage increasing action) at the charge pump section 204 is carried out until the phase difference between the output signal from the filter 201 and the input signal to the frequency adjusting section 200 is a predetermined value (90 degrees, for example) so as to obtain a gate voltage of a target level.

When the phase difference between the output signal from the filter 201 and the input signal to the frequency adjusting section 200 reaches the predetermined value, the charge pump 204 is locked to supply the gate voltage (VG) of the target level to each gate terminal of the filter 201 of the frequency adjusting section 200 and the MOSFET-C filter 100, whereby the MOSFET-C filter is driven and controlled.

It is to be noted that, the following documents (1) and (2) describe how to increase a gate voltage of an active filter by means of a charge pump section:

(1). G. L. E. Monna, J. C. Sandee, C. J. M. Verhoeven, G. Groenewold, and A. H. M. van Roermund, "Charge Pump for Optimal Dynamic Range Filters," Proceedings,1994 IEEE International Symposium on Circuits and System, vol.5,pp747–750,1994;

(2). A. Yoshizawa and Y. Tsividis, "An Anti-Blocker Structure MOSFET-C Filter For a Direct Conversion Receiver," Proceeding,2001 IEEE Custom Integrated Circuit Conference.

However, such a configuration in which the frequency adjusting section 200 having the charge pump section 204 drives a cut-off frequency control terminal (a gate terminal) of the MOSFET-C filter 100 may cause a clock signal for driving the charge pump section 204 to leak into the MOSFET-C filter 100 and present a problem in that a dynamic range of the MOSFET-C filter 100 is limited.

For example, noise from the frequency adjusting section 200 may be mixed into a gate terminal of the MOSFET-C filter 100 shown in FIG. 7, increasing the output signal from the MOSFET-C filter 100 to an excessively high level. If the signal coincides with timing of a clock signal and happens to be picked up, the dynamic range of the MOSFET-C filter, resulting in a worse characteristic of the MOSFET-C filter.

Further, in a receiving circuit of a mobile communications terminal, for example, less power consumption in the circuit is preferable in an effort to extend stand-by time for receiving calls. However, in order to control the cut-off frequency of an active filter, it is necessary for an analogue control to keep a dedicated circuit such as the frequency adjusting section 200 as shown in FIG. 8, for example, constantly active, thus resulting in a burden for reduction of power consumption.

Still further, when a digital control is used in order to control a cut-off frequency of an active filter, a D/A (digital to analogue) converter is required. As a result, the size of the circuit is increased and also its power consumption is increased.

SUMMARY OF THE INVENTION

In view of the above description of the existing problems related to the conventional art, the present invention provides an active filter circuit capable of reducing its power consumption without presenting a problem such as limit of its dynamic range.

In order to provide such an active filter circuit, an active filter circuit according to first aspect of the present invention includes: an active filter section wherein a cut-off frequency thereof is made variable upon utilizing at least one field effect transistor element having metal oxide film semiconductor structure as a variable resistor; a charge pump section for supplying voltage for controlling a variable resistance against all gate terminals of the field effect transistor element; a switch section for short-circuiting or opening contact between the gate terminals and an output terminal of the charge pump section; a capacitance element connected between ground and the gate terminals; a frequency adjusting section for supplying a control signal to the charge pump section in order to generate voltage for adjusting frequency of the active filter section; and a cut-off frequency judging section for controlling ON/OFF of the switch section according to an adjusting status of a cut-off frequency of the active filter section.

According to the active filter circuit of the first aspect of the present invention, the switch section and the capacitance element are provided between the active filter section and the charge pump section. Short-circuiting/opening (ON/OFF) the switch section is controlled by the cut-off frequency judging section. The cut-off frequency judging section controls ON/OFF of the switch section according to an adjusting status of the cut-off frequency of the active filter.

In particular, the cut-off frequency judging section judges whether or not an increased voltage at the charge pump section reaches a predetermined level, for example according to a control signal from the frequency adjusting section to the charge pump section. When the voltage increase is achieved, the switch section is set to OFF and when the increment is not achieved, the switch section is kept ON.

The switch section and the capacitance element between ground and the gate terminals of the active filter section establish a so-called sample and hold circuit, whereby the voltage applicable to the gate terminals is maintained while the switch section is OFF so as to operate the active filter section properly.

As described above, even when the switch section is OFF, that is, even in the case of opening contact between the active filter section and the charge pump section, the active filter section can be operated properly. Further, by setting the switch section to OFF, noises such as a clock signal are stopped from leaking to the active filter section, and the problem of limited dynamic range of the active filter section may be avoided.

An active filter circuit according to a second aspect of the present invention includes an active filter circuit as recited in the first preferred embodiment in which the charge pump section is stopped from operating when the switch section is under an OFF status.

According to the active filter circuit of the second aspect of the invention, when the switch section is under the OFF status, the charge pump section does not have to be operated and therefore the charge pump section is at least stopped from operating. The stop of the charge pump section may be performed by stopping power supply to the charge pump section, whereby power consumption of the active filter circuit may be reduced.

An active filter circuit according to a third aspect of the present invention includes the active filter circuit as recited in the first preferred embodiment, in which the frequency adjusting section is stopped from operating when the switch section is under the OFF status.

According to the active filter circuit of the third aspect of the present invention, when the switch section is under the OFF status, the frequency adjusting section is at least stopped operating as a boosting operation has been completed at the charge pump section. The stop at the frequency adjusting section may be performed by stopping power supply to the frequency adjusting section, whereby the power consumption of the active filter circuit may be reduced.

An active filter circuit of fourth aspect of the present invention includes the active filter circuit as recited in the first preferred embodiment, in which operations of the charge pump section and the frequency adjusting section are stopped from operating when the switch section is under the OFF status.

According to the active filter circuit of the fourth aspect of the present invention, when the switch is under the OFF status, neither the charge pump section nor the frequency adjusting section has to be operated and therefore the charge pump section and the frequency adjusting section are stopped from operating.

The stop of these circuits may be performed by stopping power supply to each circuit, whereby the power consumption of the active filter circuit may be reduced. Further, the charge pump section itself and the frequency adjusting section itself are stopped from operating, whereby noise leakage such as a leaked clock signal from these circuits to the active filter can be stopped.

An active filter circuit according to a fifth aspect of the present invention includes: an active filter section wherein a cut-off frequency thereof is made variable upon utilizing at least one field effect transistor element having metal oxide film semiconductor structure as a variable resistor; a charge pump section for supplying voltage for controlling a variable resistance against all gate terminals of the field effect transistor element; a charge pump section capable of switching from a control voltage supplying operation for supplying voltage for controlling a variable resistance against all gate terminals of the field effect transistor element to a high output impedance status preventing supply of voltage, wherein the charge pump section is capable of maintaining the voltage to be supplied to the active filter section when under the high output impedance status; a frequency adjusting section for supplying a control signal to the charge pump section in order to generate voltage for adjusting frequency of the active filter section; and a cut-off frequency judging section for controlling the control voltage supplying operation of the charge pump section and the high output impedance status based on an adjusting status of a cut-off frequency of the active filter section.

According to the active filter circuit as recited in the fifth aspect of the present invention, the charge pump section for supplying a voltage to the gate terminals of the active filter section is configured to be able to switch from a control voltage supplying operation for supplying a voltage to the gate terminals of the active filter to a high output impedance status which does not provide a voltage, and to maintain a voltage to the active filter section when under the high output impedance status.

The switching from the control voltage supplying operation to the high output impedance status is controlled by the cut-off frequency judging section. In particular, the cut-off frequency judging section judges whether or not an increased voltage at the charge pump section reaches a predetermined level according to a control signal from the frequency adjusting section to the charge pump section, for example. When the increase in voltage is achieved, the high output impedance status is selected.

As a result when in the high output impedance status, a voltage is not supplied from the charge pump section, thereby preventing a noise such as a clock signal leaked out of the charge pump section from leaking to the active filter section and also preventing the active filter section from limiting its dynamic range.

An active filter circuit as a sixth aspect of the present invention includes the active filter circuit as recited in the fifth aspect with the charge pump section stopped from operating when the charge pump section is under the high output impedance status.

According to the active filter circuit as recited in the sixth aspect of the present invention, when the charge pump section is under the high output impedance status, the charge pump section does not have to supply a voltage to the active filter section, and the voltage to be supplied to the active filter section need only be maintained and therefore the charge pump section is stopped from operating, thereby reducing the power consumption of the active filter circuit.

An active filter circuit according to a seventh aspect of the present invention includes the active filter circuit as recited in the fifth aspect, with the charge pump section and the frequency adjusting section stopped from operating when the charge pump section is under the high output impedance status.

According to the active filter circuit as recited in the seventh aspect of the present invention, when the charge pump section is under the high output impedance status, the charge pump section does not have to supply a voltage to the active filter and the voltage to be supplied to the active filter need only be maintained.

As a result, the frequency adjusting section does not have to be operated, and therefore the frequency adjusting section is stopped from operating, thereby reducing the power consumption of the active filter circuit.

An active filter circuit according to an eighth preferred embodiment of the present invention includes the active filter circuit as recited in the fifth aspect with the charge pump section and the frequency adjusting section stopped from operating when the charge pump section is under the high impedance status.

According to the active filter circuit as recited in the eighth aspect of the present invention, when the charge pump section is under the high output impedance status, neither the charge pump section nor the frequency adjusting section has to be operated. Therefore, the charge pump section and the frequency adjusting section are stopped from operating when the charge pump section is under the high output impedance status.

As a result, the power consumption of the active filter circuit may be reduced. Further, when both the charge pump section and the frequency adjusting section are stopped from operating, a noise from these circuits does not leak into the active filter section, and the dynamic range of the active filter section is not limited by such a noise.

An active filter circuit according to a ninth preferred embodiment of the present invention includes the active filter circuit as recited in the fifth aspect, with the charge pump section including a charge section for increasing a charge pump output voltage and a discharge section for decreasing the charge pump output voltage; the charge section including voltage multiplying circuit for generating a voltage by utilizing a charge holding characteristic of a rectifying element and a capacitance element; and the discharge section including a current circuit for extracting an amount of charge from a load capacitance of the charge pump section.

According to the active filter circuit as recited in the ninth aspect of the invention, the charge pump section includes a voltage multiplying circuit as a charge section and a current circuit as a discharge section. The current circuit makes the charge pump section operate at a high impedance by taking an amount of charge out of a load capacitance of the charge pump section, which is more simple than short-circuiting a transmission line of the gate voltage which is boosted above its power supply or opening the switch section such that the charge pump section is under the high output impedance status.

An active filter circuit as recited according to a tenth aspect of the present invention includes the active filter circuit as recited the ninth aspect, with the high output impedance status of the charge pump section established by stopping the voltage multiplying circuit and current cut-off by the current circuit.

According to the active filter circuit as recited in the tenth aspect of the present invention, by stopping the voltage multiplying circuit from operating and a current cut-off by the current circuit, the charge pump section ensures the high output impedance, and the power consumption of the active filter circuit is reduced by stopping the voltage multiplying circuit from operating.

As described above, according to the active filter circuits according to the present invention, power consumption may be reduced by decreasing a rate of operation of the frequency adjusting section for adjusting a frequency of the active filter section, thereby providing an active filter circuit suitable for mounting in a mobile terminal device such as a mobile phone terminal where efficient utilization of batteries is required.

Further, by opening the frequency adjusting section and the active filter section, and by stopping a circuit section of the frequency adjusting section, the target active filter section is prevented from degradation of dynamic range, which is caused by a clock signal leaked from the frequency adjusting section.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Preferred embodiments of an active filter circuit according to the present invention will be described with reference to the drawings. An active filter circuit of embodiments as described hereafter is formed in an integrated circuit (IC) and may be installed in a variety of electronic apparatuses. The active filter circuit may obtain a proper dynamic range, realize less power consumption, and be mounted in a so-called mobile terminal or the like, which is a mobile communications device.

[First Preferred Embodiment]

Figure 1:
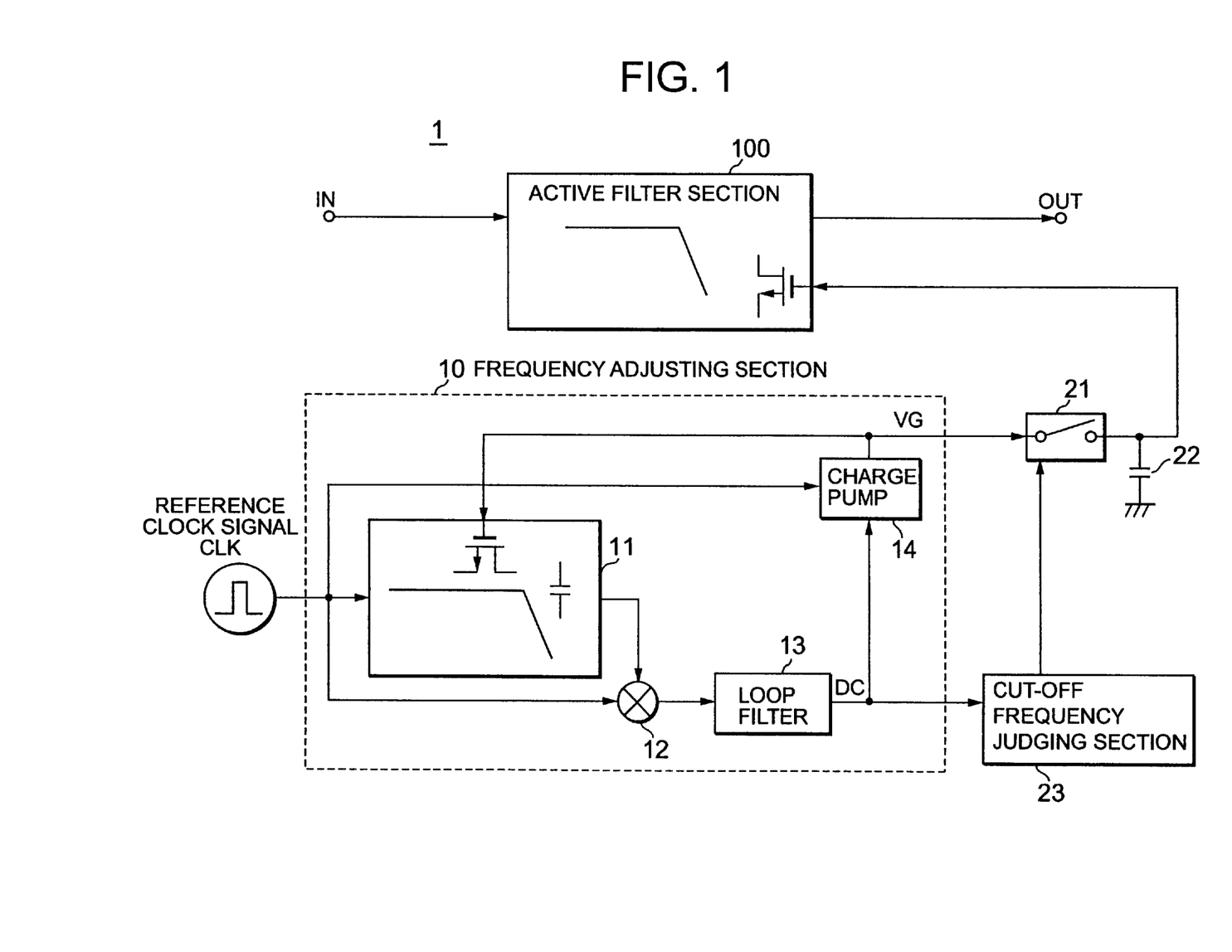
FIG. 1 is a block diagram for explaining an embodiment of an active filter circuit according to the present invention.

FIG. 1 shows a block diagram for describing an active filter circuit 1 according to a first preferred embodiment of the present invention. As shown in FIG. 1, the active filter circuit 1 of the first preferred embodiment includes, and is generally divided into, an active filter section (an active filter body) 100 and a frequency adjusting section 10, similar to an active filter circuit, for example, as shown in FIG. 9.

The active filter section 100 is the MOSFET-C filter having a structure as shown in FIG. 7. The frequency adjusting section 10 has basically the same structure as that of the frequency adjusting section 200 as shown in FIG. 8. In other words, the frequency adjusting section 10 has a structure of a so-called DLL (Delay Locked Loop) and includes a filter 11 having a function of a delay line, a multiplier 12, a loop filter 13 and a charge pump section 14.

To summarize each section constituting the frequency adjusting section 10, the filter 11, the multiplier 12 and the loop filter 13 establish a frequency adjusting section body for supplying a control signal to the charge pump section 14. Based on the control signal from the frequency adjusting section body, the charge pump section 14 boosts a voltage supplied thereto so as to output.

As a result, similar to the frequency adjusting section 200 as described above, the frequency adjusting section 10 is provided with a reference clock signal CLK which may be delayed by the filter 11 to produce an output signal. The output signal and the reference clock signal CLK are multiplied at the multiplier 12 so as to obtain a signal comprised of a doubled reference clock signal component and DC component (direct current component) which are supplied to the loop filter 13.

The loop filter 13 extracts only the DC component from the signal provided thereto so as to supply the DC component to the charge pump section 14. The charge pump section 14 which uses the DC component from the loop filter 13 as a control signal increases a voltage in the charge pump section 14 until the DC component reaches a predetermined value. The increased voltage (VG) is supplied to the filter 11 as a voltage for adjusting and also supplied to a gate terminal of each MOSFET device of the active filter section 100 as a gate voltage.

It is to be noted that the frequency adjusting section 10 in this example is designed to be stable when a phase difference between the output signal from the filter 11 and the reference clock signal CLK is 90 degrees.

In the case of the first preferred embodiment of the present invention, as shown in FIG. 1, a switch section 21 and a capacitance element 22 are provided between the charge pump section 14 of the frequency adjusting section 10 and the active filter section 100, and also a cut-off frequency judging section 23 is provided so as to toggle the switch section 21 properly.

Having the switch section 21, the capacitance element 22 and the cut-off frequency judging section 23 as described above, operation of the active filter circuit 1 according to the first preferred embodiment will be described. When a power supply to the active filter circuit is turned on (when an IC power supply is turned on), the switch section 21 is kept ON (in contact).

When the IC power supply is turned on, the gate voltage (VG) from the charge pump section 14 being around 0 V (zero volt) at first, as described above, acts so as to adjust the frequency of the filter 11 of the frequency adjusting section 10, resulting in a gradual increase. The filter 11 is a MOSFET-C filter for adjusting frequency. At last the gate voltage (VG) is stabilized at a certain value and, after obtaining the constant value, the adjustment of the cut-off frequency of the active filter circuit 1 is completed.

By supplying the gate voltage (VG) of the constant value to a gate terminal of each MOSFET element which contributes to construct the active filter section 100, the frequency adjustment of the active filter section 100. However, in general, if the charge pump section 14 and the active filter section 100 are always wired, the gate voltage (VG) must be supplied to the active filter section 100 while operating the frequency adjusting section 10 at all times.

This may cause a noise leakage from the frequency adjusting section 10 to the active filter section 100 so that a dynamic range of the active filter section 100 may be limited. Further, since the frequency adjusting section 10 is kept operating, it may be difficult to reduce power consumption.

Then, considering that an frequency adjusting input terminal of the active filter section 100 which is a target active filter in terms of characteristic of a MOSFET-C filter is constructed of gate terminals of MOSFET elements and has a high impedance in direct current, degradation of the dynamic range of the active filter may be avoided and a reduction of power consumption may be achieved by taking advantage of the characteristic.

In other words, as shown in FIG. 1, the switch section 21 and the capacitance element 22 are provided between the charge pump section 14 and the active filter section 100 such that a capacitance is disposed between ground (earth) and a node (gate terminal) between the active filter section 100 and the switch section 21, whereby a so-called sample and hold circuit is configured to maintain a voltage to the active filter section 100 when the switch section 21 is OFF This may be achieved because the active filter section 100 side corresponds to the gate terminal of the MOSFET element.

Further, in a status of an initial operation of the active filter circuit 1 as shown in FIG. 1, the switch section 21 is under the ON status (short-circuited or closed status). While the switch section 21 is under the ON status, the frequency adjusting section 10 operates to adjust the cut-off frequency of the active filter 100 so as to generate a desired gate voltage (VG).

On generating the desired gate voltage (VG), when the switch section 21 is set to the OFF status (open status), the gate voltage (VG) to be supplied to the active filter section 100 is maintained. At this time, the operation of the frequency adjusting section 10 may be stopped so that the clock signal outputted from the frequency adjusting section 10 may be prevented from leaking and the power consumption of the active filter circuit 1 may be reduced as well.

In the active filter circuit 1 of the first preferred embodiment of the present invention, the cut-off frequency judging section 23 is used as means for toggling the switch section 21. The cut-off frequency judging section 23 judges whether or not the DC component from the loop filter 13 of the frequency adjusting section 10 reaches a threshold, and supplies a signal to open (turn OFF) the switch section 21 to the switch section 21 when the DC component is judged to be the threshold.

Figure 2:
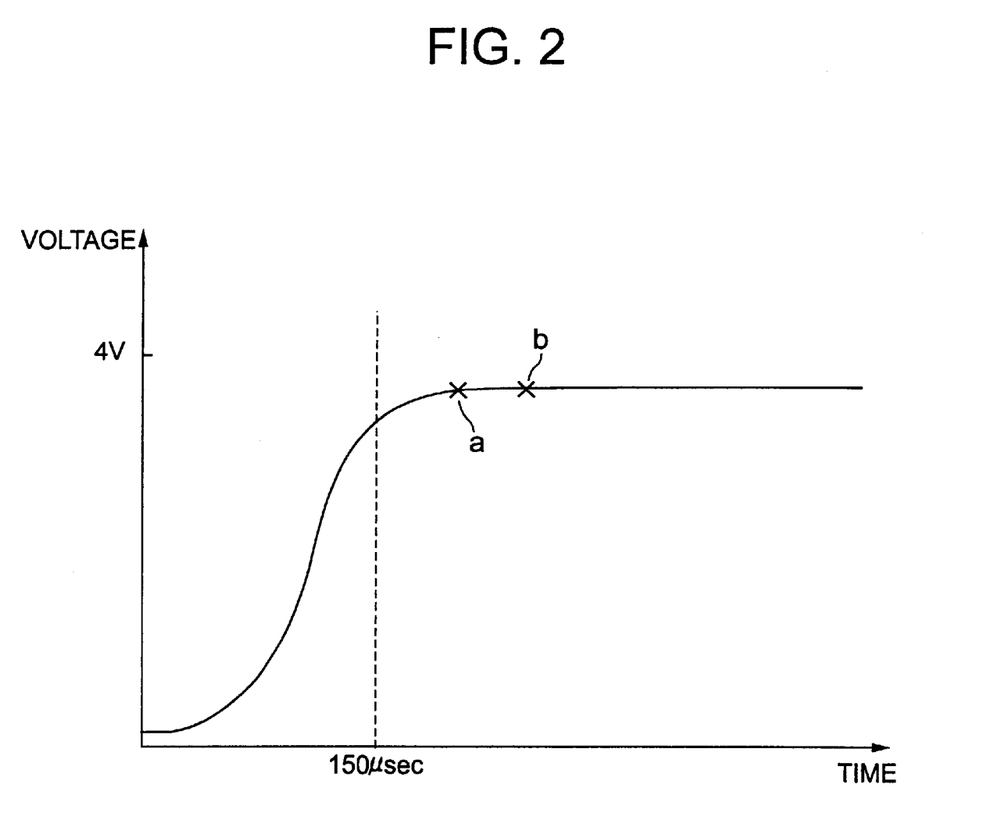
FIG. 2 is a graph for explaining a characteristic of the frequency adjusting section as shown in FIG. 1.

In particular, as shown in FIG. 2, the DC component from the loop filter 13 gradually increases its level upon turning on the power supply, and becomes stable at a constant value when it reaches a constant level. As shown in FIG. 2, when a difference in level between two points such as point a and point b of FIG. 2 is substantially 0 (zero), the DC component is judged to be the threshold, whereby the cut-off frequency judging section 23 may provide the switch section 21 with a timing signal to turn OFF the switch section 21.

The signal supplied to the cut-off frequency judging section 23 is not limited to the DC component from the loop filter 13, and may be a signal which is comprised of the doubled signal component and the DC component from a pre-stage (the multiplier 12) of the loop filter 13, further may be an output signal from the charge pump section 14.

Further, a time when the frequency adjusting section 10 is locked may be estimated based on the elements utilized, etc. For example, as shown in FIG. 2, if it is given that the frequency adjusting section 10 as illustrated in FIG. 1 is locked for approximately 150 μsec (micro seconds), the switch section 21 is only turned OFF at any time later than 150 μsec from the time the power supply is turned on, for example, in 170 μsec.

Figure 3:
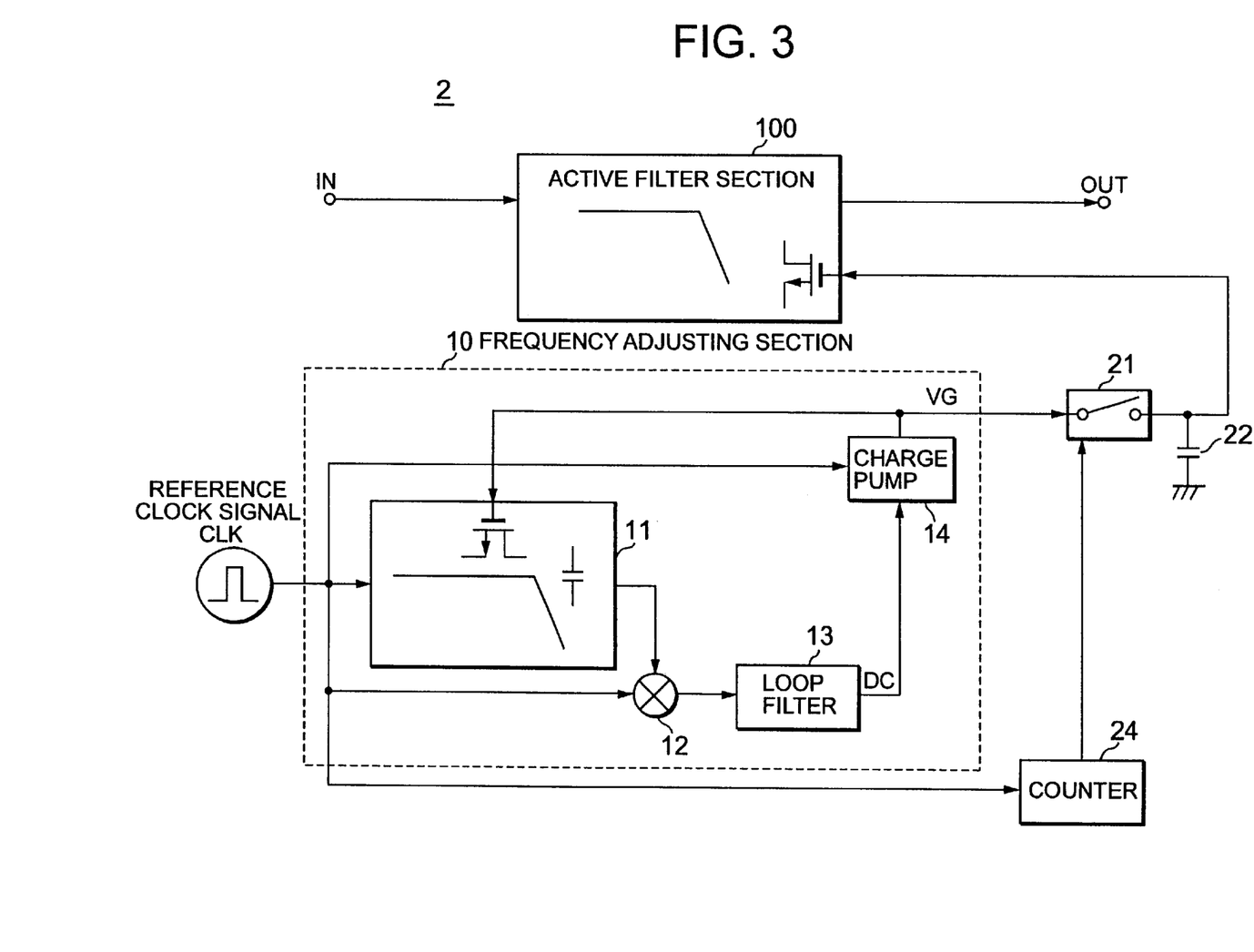
FIG. 3 is a block diagram for explaining another example of the active filter circuit according to the present invention.

As shown in FIG. 3, a counter 24 may be used to configure the active filter circuit, instead of the cut-off frequency judging section 23. The active filter circuit 2 as shown in FIG. 3 is configured, similar to the active filter circuit 1 as shown in FIG. 1 except that the counter 24 is used instead of the cut-off judging section 23.

In addition, the counter 24 is reset when the power supply is turned on, and counts the reference clock signals CLK provided to the counter 24, thereby supplying the switch section 21 with a control signal to turn OFF the switch section 21 in 170 μsec, for example, from when the power supply is turned on.

As described above, the first preferred embodiment of the present invention provides the active filter circuit 2 that uses a simple counter circuit or the like as means for toggling the switch by resetting the counter when the IC is started up, operating a function of timer by counting the reference clock signals CLK, realizing a sample and hold circuit by opening the switch section 21 which is initially closed, after a predetermined time lapse, avoiding degradation of the dynamic range of the active filter section 100 and reducing power consumption.

In this embodiment, although the counter 24 counts 170 μsec, for example, since the IC was raised, which is not limited thereto. It may be any interval such as 160 μsec, 180 μsec etc. In other words, the interval that is counted by the counter 24 need only be no less than sufficient time to lock the frequency adjusting section 10.

For purposes of simplification of description, in FIG. 1 and FIG. 3, the cut-off frequency judging section 23 and the counter 24 are disposed outside the frequency adjusting section 10, but are not limited to the disposition. The cut-off frequency judging section 23 and the counter 24 may be provided in the frequency adjusting section 10, and the switch section 21 may be toggled with output signals from these circuits.

Further, still in the first preferred embodiment, when the switch section 21 is OFF, the power consumption is reduced by stopping the operation of the frequency adjusting section 10 which includes the charge pump section 14 and a frequency adjusting section body comprised of the filter 11, the multiplier 12 and the loop filter 13, but is not limited thereto. For example, such a reduction of power consumption may be achieved by stopping at least one of the charge pump section 14 and the frequency adjusting section body of the frequency adjusting section 10.

In case at least one of either the charge pump section 14 or the frequency adjusting section body is kept operating, restoring may be quickly achieved upon turning the power supply on again.

[Second Preferred Embodiment]

As for the active filter circuits 1 and 2 as shown respectively in FIG. 1 and FIG. 3, the gate voltage (VG) is higher than the voltage of the power supply. Therefore, if a switch similar to the switch section 21 is desired to be located within an IC circuit, it is not simply possible to mount the switch, which provides a good sample, and hold characteristic. If the switch similar to the switch section 21 is realized by means of pMOS (p-channel MOSFET), a charge pump circuit should supply the pMOS with a high voltage in order to operate the pMOS as a switch.

Thus, without using such a switch and a capacitance element respectively similar to the switch section 21 and the capacitance element 22 disposed in the active filter circuits 1 and 2 as shown in FIG. 1 and FIG. 3, it is desired to construct an active filter circuit capable of avoiding degradation in dynamic range and realizing reduction of power consumption.

By devising a construction of the charge pump section, the active filter circuit according to the second preferred embodiment of the present invention eliminates necessity to dispose a switch section and a capacitance element, avoids degradation of a dynamic range, realizes reduction in power consumption, and further, is constructed to be suitable for implementing in an IC.

Figure 4:
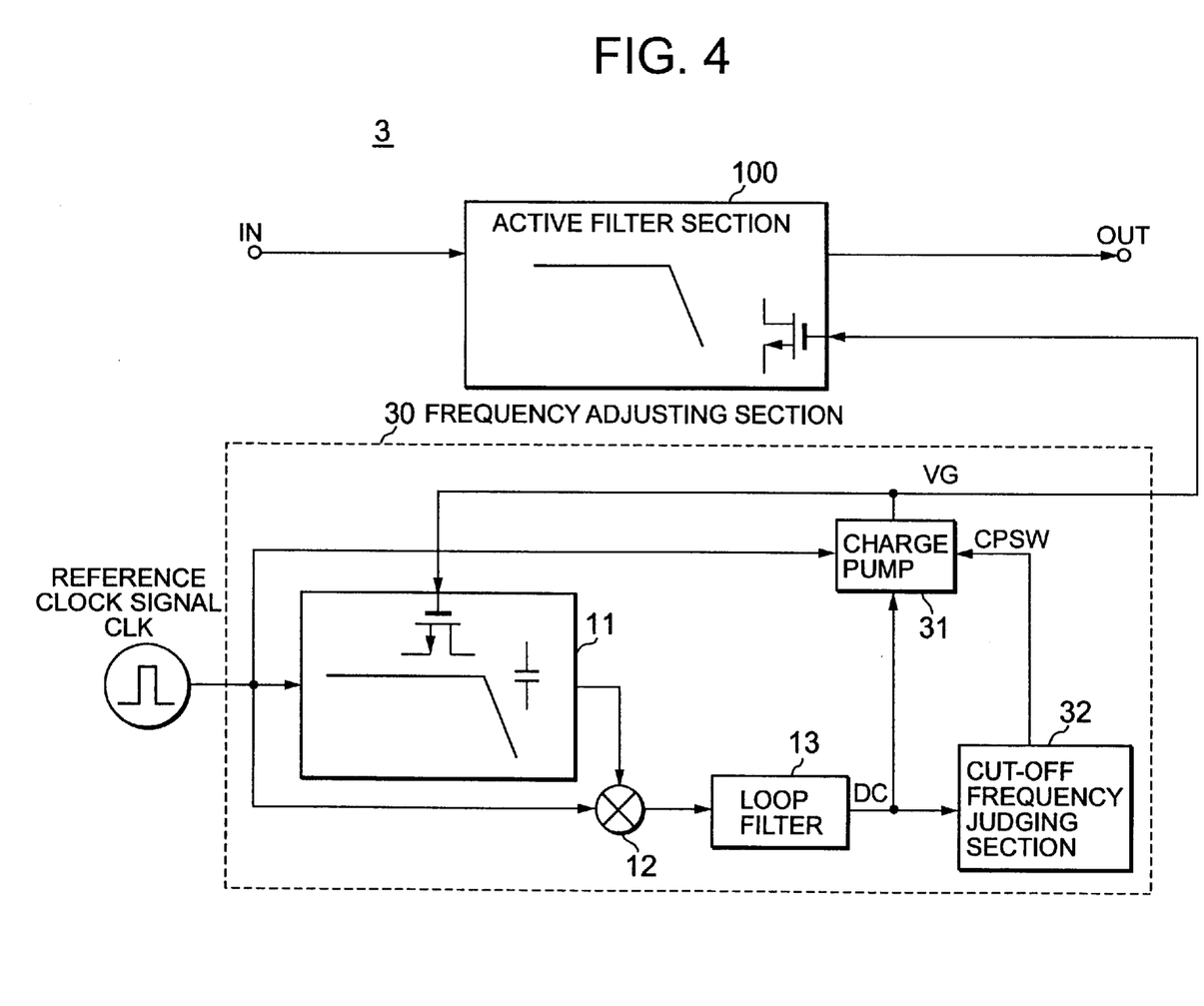
FIG. 4 is a block diagram for explaining another embodiment of the active filter circuit according to the present invention.
Figure 5:
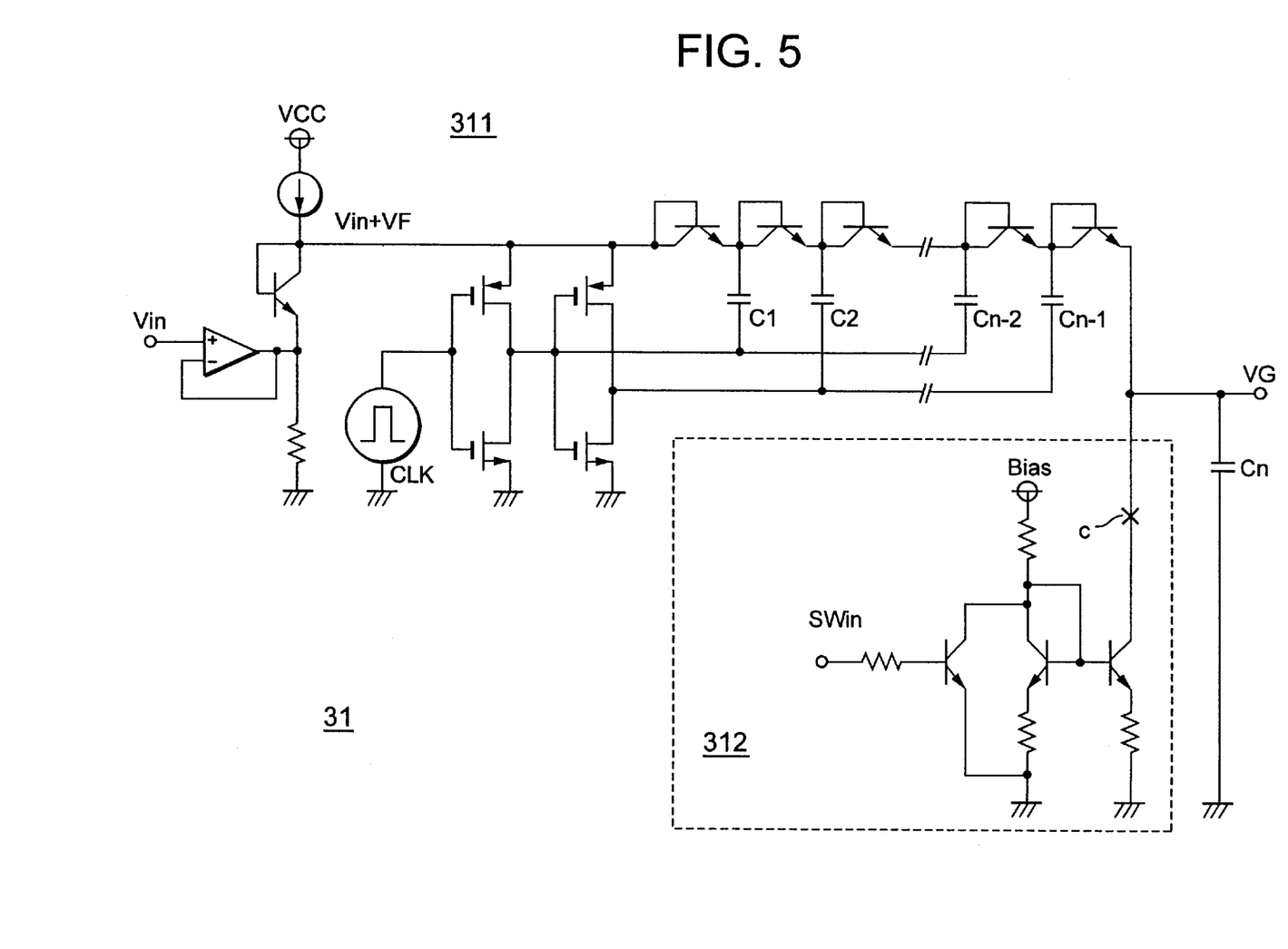
FIG. 5 is a circuit diagram for explaining a charge pump section of the active filter circuit as shown in FIG. 4.

FIG. 4 is a block diagram for explaining the active filter circuit 3 according to the second preferred embodiment of the invention, and FIG. 5 is a circuit diagram for explaining the charge pump section 31 of the active filter circuit 3 as shown in FIG. 4.

As shown in FIG. 4, the active filter circuit 3 of the second preferred embodiment is also comprised of an active filter section 100 and a frequency adjusting section 30. In addition, in the active filter circuit 3 as shown in FIG. 4, the active filter section 100 is a MOSFET-C filter having a structure as shown in FIG. 7 similar to the first preferred embodiment of the present invention.

Further, the frequency adjusting section 30 has basically the same structure as the frequency adjusting section 10 of the first preferred embodiment as described above, a DLL structure as mentioned above. As shown in FIG. 4, the frequency adjusting section 30 of the active filter circuit 3 of the second preferred embodiment includes a filter 11 having a function of a delay line, a multiplier 12, a loop filter 13, a charge pump section 31, and a cut-off frequency judging section 32.

The filter 11, the multiplier 12, and the loop filter 13 are similar to those elements used in the frequency adjusting section 10 of the active filter circuits 1 and 2 according to the first preferred embodiment of the present invention.

In the active filter circuit 3 of the second preferred embodiment as shown in FIG. 4, the charge pump section 31 of the frequency adjusting section 30 generates a gate voltage (VG) being supplied to a gate terminal of each MOSFET of the active filter section 100, similar to the charge pump section 14 used in the active filter circuits 1 and 2 of the first preferred embodiment.

The charge pump section 31 in accordance with the second preferred embodiment, however, not only generates the gate voltage (VG) but also is configured to switch from a control voltage supplying operation for supplying the active filter section 100 with the generated voltage to a high output impedance status in which the gate voltage is not supplied to the active filter section 100 but a voltage applicable to the active filter section 100 is maintained or vice-versa.

In other words, the charge pump section 31 of the second preferred embodiment is formed to accommodate a switch function to switch operations and a capacitance function to hold voltage and then, to switch from the control voltage supplying operation of the charge pump section 31 to the high output impedance status, or vice versa, by means of a switch control signal CPSW from the cut-off frequency judging section 32.

In this case, similar to the cut-off frequency judging section 23 in the active filter circuit 1 of the first preferred embodiment as described with reference to FIG. 1 and FIG. 2, the cut-off frequency judging section 32 monitors the DC current from the loop filter 13 and judges whether the frequency adjusting section 30 is locked or not. Then, the cut-off frequency judging section 32 forms the switch control signal CPSW which is at a low level until the frequency adjusting section 30 is locked or is at a high level upon lock of the frequency adjusting section 30. The switch control signal CPSW is supplied to the charge pump section 31.

The charge pump section 31 is in a status of control voltage supplying operation when the switch control signal CPSW from the cut-off frequency judging section 32 is at the low level. A transition from a status of control voltage supplying operation to the status of high output impedance occurs when the switch control signal CPSW changes from the low level to the high level.

When the charge pump section 31 is under the status of high output impedance, the supply of the gate voltage (VG) from the charge pump section 31 to the active filter section 100 is stopped. However, by maintaining the voltage applicable to the active filter section 100, the active filter section 100 still keeps operating properly even after the supply of the gate voltage is stopped.

In the active filter circuit 3 of the second preferred embodiment, the charge pump section 31 is configured as shown in FIG. 5. In the charge pump section 31 as shown in FIG. 5, a charge section 311 is constructed of a voltage multiplier, and a discharge section 312 is constructed of a constant power supply (current circuit) having an ON/OFF switch function.

The charge section 311 is constituted by diodes of n-steps and n capacitance elements so as to generate an input voltage magnified by approximately n+1 times. On the other hand, the discharge section 312 has a circuit structure to provide an ON/OFF operation according to the switch control signal CPSW supplied to a terminal SWin.

When the switch control signal CPSW includes a signal of low level, a potential at point c of the discharge section 312 is low so that the discharge section 312 is turned to the ON status. During the ON status the discharge section 312 takes a certain rate of current from a load capacitor Cn so as to carry out a discharge operation. While the gate voltage VG boosted in the charge section 311 is supplied to the active filter section 100. In other words, when the discharge section 312 is under the ON status, the charge pump section 31 is in a status of control voltage supplying operation.

Conversely, when the switch control signal CPSW includes a signal of high level, the potential at point c of the discharge section 312 is high, and the discharge section 312 is under the OFF status. During the OFF status, a discharge path of the charge stored in the load capacitance Cn is stopped so that the gate voltage VG boosted in the charge section 311 is not supplied to the active filter section 100. In other words, when the discharge section 312 in the OFF status, the charge pump section 31 is under the status of high output impedance.

In this sense, the discharge section 312 performs a function equivalent to the switch section 21 in the active filter circuits 1 and 2 of the first preferred embodiment as described above with reference to FIG. 1 and FIG. 3. When the discharge section 312 is under the OFF status, the load capacitance Cn which is a part of the charge section 311 plays a role of load capacitance of sample and hold. Thus, for the active filter circuit 3 of the second preferred embodiment does not require the switch section 21 or the capacitor 22 as in the active filter circuits 1 and 2 of the first preferred embodiment as described above with reference to the FIG. 1 and FIG. 3.

As described above, by accommodating a current circuit which includes the discharge section 312 of a relatively simple structure in the charge pump section 31, the charge pump 31 may be switched from the status of control voltage supplying operation to the status of high output impedance or vice versa. During the status of high output impedance, the gate voltage VG is not supplied from the charge pump section 31, however, the gate voltage VG to the active filter section 100 is maintained so as to operate the active filter section 100 properly.

When the charge pump section 31 is under the status of high output impedance, the charge pump section 31 does not have to be kept operating. Thus, stopping of the power supply to the charge pump section 31 may prevent a leak of the clock signal from the charge pump section 31 to the active filter section 100, avoid a degradation of a dynamic range of the active filter section 100, and reduce power consumption of the active filter circuit 3.

It is possible to obtain a good sample and hold characteristic without providing any specific switch section that may require a larger scale to obtain a good sample and hold characteristic. Further, any additional load capacitance is unnecessary to obtain such a sample and hold characteristic. By utilizing load capacitance in the voltage multiplier, a sample and hold circuit may be constructed.

The active filter circuit 3 of the second preferred embodiment as described above with reference to FIG. 4 and FIG. 5 may be applicable so as to implement in an IC, secure a good dynamic range, and further realize a reduction of power consumption, thereby being suitable for a mobile communications terminal device such as a mobile phone terminal, including a cellular phone device.

Figure 6:
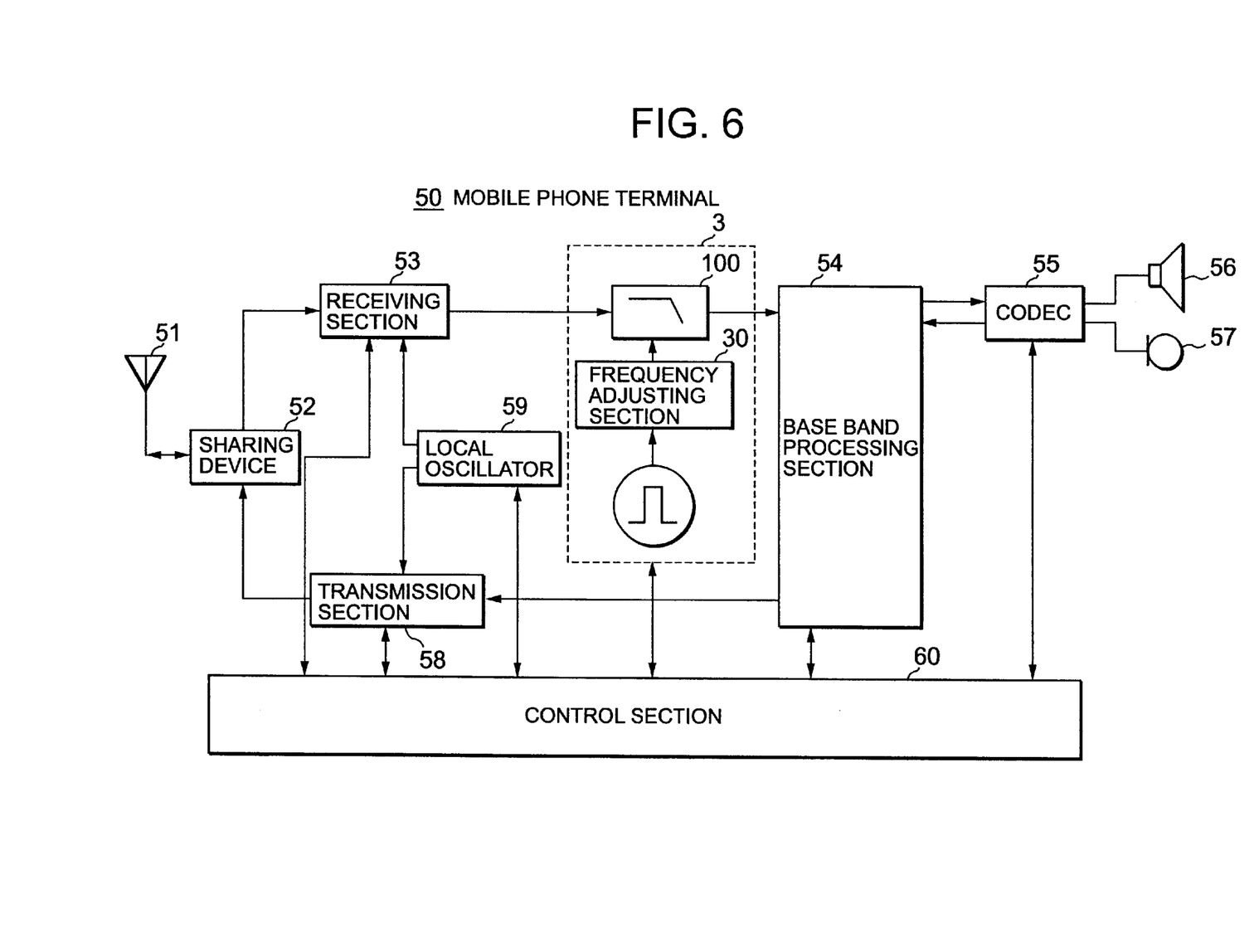
FIG. 6 is a block diagram for explaining the active filter circuit as shown in FIG. 4 when mounted in a mobile phone terminal.

FIG. 6 is a block diagram for explaining a particular disposition of the active filter circuit 3 of the second preferred embodiment of the present invention when mounted in a mobile phone terminal 50. As shown in FIG. 6, the active filter circuit 3 of the second preferred embodiment is disposed to follow the receiving section 53, and used to accommodate a selected and demodulated base band signal within a predetermined frequency range, for example.

In other words, a signal received via a transceiver antenna 51 is supplied, through a sharing device 52, to a receiving section 53 where a target channel signal is selected and detected to transform to a base band signal. The base band signal transformed in the receiving section 53 is supplied to the active filter circuit 3 where an excessive frequency component is removed so as to provide a base band processing section 54 with the base band signal accommodated in the predetermined frequency range.

The base band processing section 54 performs an A/D (analogue to digital) conversion of the base band signal obtained from the active filter circuit 3, eliminates adverse effects such as fading, determines a kind of the received signal, de-interleaves, corrects an error, performs an adequate decoding process, and isolates audio data from other communication data. The audio data is supplied to a codec 55 including a DSP (Digital Signal Processor). While other communication data such as various control information and character data are supplied to a control section 60.

The codec 55 performs a D/A conversion of the audio data obtained from the base band processing section 54 so as to form an analogue audio signal which is supplied to a loudspeaker 56. The loudspeaker 56 is driven by the analogue audio signal from the codec 55 so as to transmit sound according to the received signal.

On the other hand, when the communication data supplied from the base band processing section 54 the control section 60 are the control data and character data for the mobile phone terminal, they are temporarily stored in a memory (not shown) such as a RAM (Random Access Memory) of the control section 60 so as to be used in the mobile phone terminal. Further, other communication data are supplied to an external electronic device (external device) such as a personal computer, which is connected to the mobile phone terminal via an external I/F (interface) and an input terminal (not shown), which are included in the mobile phone terminal 50.

Some explanations about a transmission system of the mobile phone terminal as shown in FIG. 6 will be added hereto. A microphone 57 converts an acquired sound to an analogue audio signal to be supplied to the codec 55. The codec 55 converts the analogue audio signal obtained from the microphone 57 to a digital audio signal (A/D conversion) which is supplied to the base band processing section 54.

The base band processing section 54 encodes and compresses the digital audio signal received from the codec 55 by means of a predetermined coding method so as to form a given block. Further, the base band processing section 54 forms the digital data into the given block so that the digital data may be supplied to the mobile phone terminal via an external input/output terminal and an external I/F. Furthermore, the base band processing section 54 combines the compressed digital audio signal and the digital data received from the external device so as to supply the combined data to a transmission section 58.

The transmission section 58 forms a modulating signal according to the digital data obtained from the base band processing section 54. In order to convert the modulating signal to a predetermined transmission frequency, the modulating signal and a signal for conversion from a local oscillator 59 are mixed together to form a modulated signal for transmission. The modulated signal for transmission, which is formed at the transmission section 58, is transmitted from the transceiver antenna 51 via the sharing device 52.

In the mobile phone terminal 50 as shown in FIG. 6 including such a receiving system and transmission system, the control section 60 monitors a received signal from the base band processing section 54, when in condition to receive calls, so as to detect an incoming call to the phone itself. After detection of such an incoming call, the control section 60 controls a ringer so as to transmit a ringing tone (ringer tone), thereby informing a user of the mobile phone terminal 50 about the incoming call.

When the user of the mobile phone terminal responds to the incoming call by performing a call starting operation such as depressing an off-hook key (call starting key) disposed on a key operating section having ten-key buttons or the like and a variety of function keys (not shown) which are mounted on the mobile phone terminal of the present embodiment, the control section 60 transmits a call answer via the transmission system so as to connect to a communication line, whereby communication is permitted by operations of the receiving system and the transmission system as described above.

After performance of the call starting operation such as depressing the off-hook key of the key operating section, an outgoing call from the mobile phone terminal of the present embodiment may be made by dialing the keys of the key operating section or by selecting a destination phone number from a list of telephone numbers registered beforehand.

As a result, the control section 60 makes a request for a call to be transmitted through the transmission system so as to connect to the destination phone terminal over a communication line. On receipt of a call answer from the destination, the connection thereto is confirmed and a communication is permitted by operations of the receiving system and the transmission system, as described above.

In such a mobile phone terminal 50 as described above, the active filter circuit 3 is disposed between the receiving section 53 and the base band processing section 54 so that the base band signal obtained by detection may be appropriately processed as a signal within the predetermined frequency range.

In this way, the active filter circuit 3 of the second preferred embodiment provides sufficient effects even when it is mounted in a mobile communications terminal such as a mobile phone terminal. Further, the active filter circuit 3 may be mounted in any type of mobile phone terminal such as TDMA (Time Division Multiple Access) system, CDMA (Code Division Multiple Access) system or the like.

Assuming, for example, that a load capacitance Cn is 30 pF as a typical design value which may permit a charge pump section to be implemented in an IC, that the switch control signal CPSW is a signal of the high level, that a switch of the discharge section (constant current supply) is under the OFF status, and that an amount of leak current is about 6 pF, for example, when the gate voltage VG is 3 V, it takes 15 msec (milliseconds) to reduce the gate voltage VG by 0.1%.

Thus, for example, a sufficient desired effect is expected, when a receiver which permits an intermittent operation such as a mobile phone terminal of TDMA system generates a gate voltage (VG) so as to be maintained and to stop the frequency adjusting section 30 at the same time. In other words, such a receiver completes a proper signal process by the active filter and does not increase its power consumption or reduce battery life even if the active filter circuit is mounted therein.

For a receiver that requests continuous receiving such as a CDMA receiver, the frequency adjusting section 30 is intermittently operated so as to refresh a gate voltage (VG) every 10 msec, for example. As a result, if an active filter circuit of the present invention is mounted in a receiver capable of continuous receiving, the receiver may always perform proper signal processing by the active filter; the receiver operates the active filter circuit intermittently and therefore neither increases its power consumption nor reduces battery life even if the active filter circuit 3 is mounted therein.

It is to be noted that, in the active filter circuit 3 of the second preferred embodiment of the present invention, when the discharge section 312 is under the OFF status, the frequency adjusting section 30 is stopped, thus reducing power consumption, but is not limited thereto. Similar to the first preferred embodiment as described above, either a frequency adjusting section body comprised of the filter 11, the multiplier 12, and the loop filter 13 in the frequency adjusting section 30 or the charge pump section 31 is stopped, thus reducing power consumption.

Although the invention having been described in its preferred form with a certain degree of particularity, other changes, variations, combinations and sub-combinations are possible therein. It is therefore to be understood that any modifications will be practiced otherwise than as specifically described herein without departing from the scope and spirit of the present invention.

For example, in the above mentioned preferred embodiments of the present invention, the active filter section 100 is described as a low pass filter, for example, but is not limited thereto. Any kind of active filters such as a high pass filter, a band pass filter, an all-pass filter etc. each having a high impedance may be an active filter section of the active filter circuit according to the present invention.

Also, in the second preferred embodiment, although the active filter circuit 3 mounted in a mobile phone terminal exemplified for explanation, the active filter circuits 1 and 2 of the first preferred embodiment may be mounted in such a mobile phone terminal. The active filter circuit according to either the first or the second preferred embodiment may be suitable for mounting in a so-called mobile terminal such as a PDA (personal digital assistant) having a communication function or a laptop personal computer. It is not limited to such mobile terminal devices, but an active filter circuit according to the present invention may be mounted in various electronic devices.

What is claimed is:

1. An active filter circuit comprising:
    an active filter section wherein a cut-off frequency is variable by utilizing at least one field effect transistor element having a metal oxide film semiconductor structure as a variable resistor;
    a charge pump section for supplying a voltage for controlling a variable resistance fed to a gate terminal of each said field effect transistor element;
    a switch section for short-circuiting or opening a connection between said gate terminal and an output terminal of said charge pump section;
    a capacitance element connected between ground and said gate terminal;
    a frequency adjusting section for supplying a control signal to said charge pump section to generate said voltage for adjusting the cut-off frequency of said active filter section; and
    a cut-off frequency judging section for controlling an ON/OFF condition of said switch section according to an adjusting status of the cut-off frequency of said active filter section.

2. The active filter circuit according to claim 1 wherein said charge pump section is stopped from operating when said switch section is in the OFF condition.

3. The active filter circuit according to claim 1 wherein said frequency adjusting section is stopped from operating when said switch section is in the OFF condition.

4. The active filter circuit according to claim 1 wherein said charge pump section and said frequency adjusting section are stopped from operating when said switch section is in the OFF condition.

5. An active filter circuit comprising:
    an active filter section wherein a cut-off frequency is variable by utilizing at least one field effect transistor element having a metal oxide film semiconductor structure as a variable resistor;
    a charge pump section for supplying a control voltage for controlling a variable resistance fed to a gate terminal of each said field effect transistor element;
    a charge pump switch section for switching from a control voltage supplying operation for supplying voltage for controlling the variable resistance fed to the gate terminal of each said field effect transistor element to a high output impedance status preventing supply of voltage, wherein said charge pump section maintains said voltage supplied to said active filter section when under said high output impedance status;
    a frequency adjusting section for supplying a control signal to said charge pump section to generate the voltage for adjusting the cut-off frequency of said active filter section; and
    a cut-off frequency judging section for controlling said control voltage supplying operation of said charge pump section and said high output impedance status based on an adjusting status of the cut-off frequency of said active filter section.

6. The active filter circuit according to claim 5 wherein said charge pump section is stopped from operating when said charge pump section is under said high output impedance status.

7. The active filter circuit according to claim 5 wherein said frequency adjusting section is stopped from operating when said charge pump section is under said high output impedance status.

8. The active filter circuit according to claim 5 wherein said charge pump section and said frequency adjusting section are stopped from operating when said charge pump section is under said high output impedance status.

9. The active filter circuit according to claim 5, wherein said charge pump section includes a charge section for increasing a charge pump output voltage and a discharge section for decreasing said charge pump output voltage;

said charge section includes a voltage multiplying circuit for generating a voltage by utilizing a charge holding characteristic of a rectifying element and a capacitance element thereof; and said discharge section includes a current circuit for extracting an amount of charge from a load capacitance of said charge pump section.

10. The active filter circuit according to claim 9 wherein said high output impedance status of said charge pump section is established by stopping an operation of said voltage multiplying circuit and cutting-off current flow of said current circuit.

* * * * *